(12) United States Patent
Lee (10) Patent No.: US 8,879,261 B2
(45) Date of Patent: Nov. 4, 2014

(54) HEAT-DISSIPATING DEVICE FOR ELECTRONIC APPARATUS

(71) Applicant: Icepipe Corporation, Seoul (KR)

(72) Inventor: Sang-Cheol Lee, Gyeonggi-do (KR)

(73) Assignee: Icepipe Corporation, Seoul (KR)

( * ) Notice: Subject to any disclaimer, the term of this patent is extended or adjusted under 35 U.S.C. 154(b) by 217 days.

(21) Appl. No.: 13/660,721

(22) Filed: Oct. 25, 2012

(65) Prior Publication Data

US 2013/0044433 A1    Feb. 21, 2013

Related U.S. Application Data (63) Continuation of application No. PCT/KR2011/002653, filed on Apr. 14, 2011.

(30) Foreign Application Priority Data

May 24, 2010 (KR) .................. 10-2010-0048265
Aug. 19, 2010 (KR) .................. 10-2010-0080158

(51) Int. Cl.
*H05K 7/20* (2006.01)
*F28D 15/02* (2006.01)
*H01L 23/427* (2006.01)
*G06F 1/20* (2006.01)
*F28D 15/00* (2006.01)

(52) U.S. Cl.
CPC .............. *G06F 1/20* (2013.01); *F28D 15/0275* (2013.01); *H01L 23/427* (2013.01)
USPC ............... 361/700; 165/104.21; 165/104.26; 165/104.33; 165/80.4; 361/679.52; 174/15.2; 257/715; 257/E23.088

(58) Field of Classification Search
CPC ............... G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ............... 361/679.46–679.54, 688–723, 700, 361/679.52; 165/80.4–80.5, 104.33, 185, 165/104.21, 104.26; 174/15.1–15.3, 174/16.1–16.3, 547–548; 257/706–722
See application file for complete search history.

(56) References Cited

U.S. PATENT DOCUMENTS

| | | | |
|---|---|---|---|
| 6,181,553 B1 * | 1/2001 | Cipolla et al. ........... 361/679.54 |
| 6,789,312 B2 * | 9/2004 | White ............................. 29/832 |
| 6,989,990 B2 * | 1/2006 | Malone et al. ................ 361/699 |
| 7,284,596 B2 * | 10/2007 | Larson ......................... 165/80.3 |
| 7,515,417 B2 * | 4/2009 | Lee et al. ...................... 361/700 |
| 8,773,855 B2 * | 7/2014 | Lee ............................... 361/700 |
| 2002/0017378 A1 * | 2/2002 | Hu ............................... 165/80.3 |
| 2002/0121365 A1 * | 9/2002 | Kozyra ......................... 165/185 |
| 2004/0165354 A1 * | 8/2004 | Mochizuki et al. ........... 361/705 |
| 2004/0201958 A1 | 10/2004 | Lev |
| 2005/0180109 A1 * | 8/2005 | Miyazaki et al. ............. 361/700 |
| 2005/0207115 A1 * | 9/2005 | Barsun et al. ................ 361/690 |
| 2006/0102324 A1 * | 5/2006 | Mok et al. ................ 165/104.33 |
| 2007/0107875 A1 * | 5/2007 | Lee et al. .................. 165/104.26 |
| 2007/0242438 A1 * | 10/2007 | Belits et al. .................... 361/700 |
| 2007/0277958 A1 * | 12/2007 | Huang ......................... 165/80.3 |
| 2008/0094798 A1 * | 4/2008 | Lee et al. ...................... 361/687 |

FOREIGN PATENT DOCUMENTS

| | | | | |
|---|---|---|---|---|
| JP | 04023456 A | * | 1/1992 | ........... H01L 23/427 |
| JP | 2006319334 A | | 11/2006 | |
| KR | 1020090075980 A | | 7/2009 | |
| KR | 1020090128691 A | | 12/2009 | |

OTHER PUBLICATIONS

"International Preliminary Report on Patentability", International Preliminary Report On Patentability with Written Opinion issued Nov. 27, 2012, received in corresponding PCT Application No. PCT/KR2011/002653, 5 pgs. (English language).

"International Search Report", International Search Report mailed Nov. 29, 2011, received in corresponding PCT Application No. PCT/KR2011/002653, 2 pgs (English language).

\* cited by examiner

*Primary Examiner* — Zachary M Pape
*Assistant Examiner* — Razmeen Gafur
(74) *Attorney, Agent, or Firm* — Grossman Tucker Perreault & Pfleger, PLLC (57) ABSTRACT

A heat-dissipating device for an electronic apparatus can include: a thermal base coupled to a first electronic component in such a manner that enables heat-transfer therebetween so that heat generated by the first electronic component mounted on a substrate is absorbed thereby; and a vibrating capillary-shaped heat-pipe loop comprising a first heat-absorption portion coupled with the thermal base in such a manner that enables heat-transfer therebetween and a heat-dissipating portion configured to dissipate heat absorbed by the first heat-absorption portion, the heat-pipe loop having working fluid injected thereinto. The heat-pipe loop can be radially disposed with a central area thereof hollowed out, and an assembly area of a coupling member can be exposed in the central area so that the coupling member for coupling the thermal base to the substrate is coupled through the central area.

13 Claims, 10 Drawing Sheets

HEAT-DISSIPATING DEVICE FOR ELECTRONIC APPARATUS

CROSS-REFERENCE TO RELATED APPLICATIONS

This application is a continuation of PCT/KR2011/002653 filed Apr. 14, 2011, which claims the benefit of Korean Patent Application Nos. 10-2010-0048265, filed with the Korean Intellectual Property Office on May 24, 2010 and 10-2010-0080158 filed with the Korean Intellectual Property Office on Aug. 19, 2010, the disclosures of which are incorporated herein by reference in their entirety.

TECHNICAL FIELD

The present invention relates to a heat-dissipating device for an electronic apparatus.

BACKGROUND ART

Generally, electronic components, such as the central processing unit (CPU) of a computer, the chipset of a video card, power transistors, and light-emitting diodes (LEDs), generate heat during the operation. If the electronic component overheats in an electronic apparatus such as a computer, the electronic component may malfunction or be damaged, and thus a heat-dissipating device is essentially required to prevent the electronic component from overheating.

An example of the heat-dissipating device employed in the electronic component is the conventional heat-dissipating pin structured heat-dissipating device. However, with the conventional heat-dissipating pin structured heat-dissipating device, it is difficult to keep the surface area of the heat-dissipating pins wide while electronic components that are becoming smaller require that the size of heat-receiving portions be smaller. Moreover, since the heat-dissipating property can be maintained only if the heat-dissipating pins are arranged in a specific direction, there is too much restriction in disposing the heat-dissipating device.

Particularly, while the chipsets for video cards or CPU are increasingly designed for high performance and thus generate a large amount of heat, despite their small size, the conventional heat-dissipating pin structure is not fit for configuring a large-scale heat-dissipating device for dissipating a large amount of heat. That is, since the heat-dissipating pins need to be formed to be thick and wide for transfer of a large amount of heat if a large-scale heat-dissipating device is to be configured in the conventional heat-dissipating pin structure, the heat-dissipating device becomes, in effect, heavy and structurally vulnerable. Accordingly, it is difficult to install the large-scale heat-dissipating device configured with the heat-dissipating pin structure in a board in which the chipsets for video cards or CPU are mounted.

Moreover, problems exist in assembling the large-scale heat-dissipating device configured in the heat-dissipating pin structure. Generally, areas where the heat-dissipating device can be mounted in a board such as a main board are very limited to peripheral areas where the chipsets for video cards or CPU are mounted. However, since the conventional heat-dissipating device, in which the heat-dissipating pins are tightly arranged from its center, inevitably covers the area of the board where the heat-dissipating device is mounted, it is difficult for a tool or a hand of the assembling worker to reach the mounting area of the heat-dissipating device, complicating the assembly.

Suggested accordingly has been a structure of dissipating the heat through the heat-dissipating pins after the heat generated by the chipsets of the video cards or CPU is transferred using a long heat pipe, but this structure of heat-dissipating device has a long heat-transfer path that lowers the heat-transfer efficiency and causes a bottleneck of heat transfer.

To complement these limitations, the conventional heat-dissipating device may further include a high-speed heat-dissipating fan. However, adding the heat-dissipating fan also causes a problem of noise and increased power consumption.

DISCLOSURE

Technical Problem

The present invention provides a large-scale heat-dissipating device for an electronic apparatus that can be mounted on a board.

The present invention also provides a heat-dissipating device for an electronic apparatus that can be readily assembled on a board.

The present invention also provides a heat-dissipating device that operates with no or little noise.

Technical Solution

An aspect of the present invention features a heat-dissipating device for an electronic apparatus, which can include: a thermal base coupled to a first electronic component in such a manner that enables heat-transfer therebetween so that heat generated by the first electronic component mounted on a substrate is absorbed thereby; and a vibrating capillary-shaped heat-pipe loop comprising a first heat-absorption portion coupled with the thermal base in such a manner that enables heat-transfer therebetween and a heat-dissipating portion configured to dissipate heat absorbed by the first heat-absorption portion, the heat-pipe loop having working fluid injected thereinto. The heat-pipe loop can be radially disposed with a central area thereof hollowed out, and an assembly area of a coupling member can be exposed in the central area so that the coupling member for coupling the thermal base to the substrate is coupled through the central area.

The heat-pipe loop can be formed in a spiral structure and disposed in an annular shape so that the heat-dissipating portion is radially formed.

The coupling member can include: a support bar of which one end is coupled on the substrate and the other end is coupled to the thermal base; and a coupling screw configured to couple the support bar to the substrate or the thermal base.

The heat-dissipating device for an electronic apparatus can also include a first heat-transfer pipe having working fluid injected thereinto and having a wick formed on an inner wall thereof and coupled with the first electronic component and the heat-pipe loop in such a manner that enables heat-transfer therebetween.

One end part of the first heat-transfer pipe can be coupled with the first electronic component in such a manner that enables heat-transfer therebetween, and the other end part of the first heat-transfer pipe can be disposed on the thermal base so as to be coupled with the first heat-absorption portion of the heat-pipe loop in such a manner that enables heat-transfer therebetween.

The one end part of the first heat-transfer pipe can be disposed on one surface of the thermal base facing toward the first electronic component, and the other end part of the first heat-transfer pipe can be disposed in an annular shape on the other surface of the thermal base supporting the radially-disposed heat-pipe loop.

The thermal base can have a chamber, into which working fluid is injected, formed therein, and the chamber can have a wick formed on a wall thereof.

The thermal base can include: a base member having one side thereof protruded so as to be coupled with the first electronic component in such a manner that enables heat-transfer therebetween and having the other side thereof caved in so that the chamber is formed therein; a wick member coupled to an inside wall of the caved-in base member; and a cover member covering the wick member and the other side of the base member.

The wick member can include a sintered wick.

The sintered wick can be fabricated first before being coupled to the base member. The heat-dissipating device for an electronic apparatus can also include a second heat-transfer pipe having a wick formed on an inner wall thereof and having working fluid injected thereinto. One end part of the second heat-transfer pipe can be coupled with a second electronic component, which is mounted on the substrate or a supplementary substrate coupled to the substrate, in such a manner that enables heat-transfer therebetween, and the other end part of the second heat-transfer pipe can be coupled with a second heat-absorption portion, which is formed on the heat-pipe loop, in such a manner that enables heat-transfer therebetween.

The heat-dissipating device for an electronic apparatus can also include a thermal block formed in an annular shape and coupled with the radially-disposed heat-pipe loop and the other end part of the second heat-transfer pipe.

MODE FOR INVENTION

Hereinafter, certain embodiments of the present invention will be described in detail with reference to the accompanying drawings.

Figure 1:
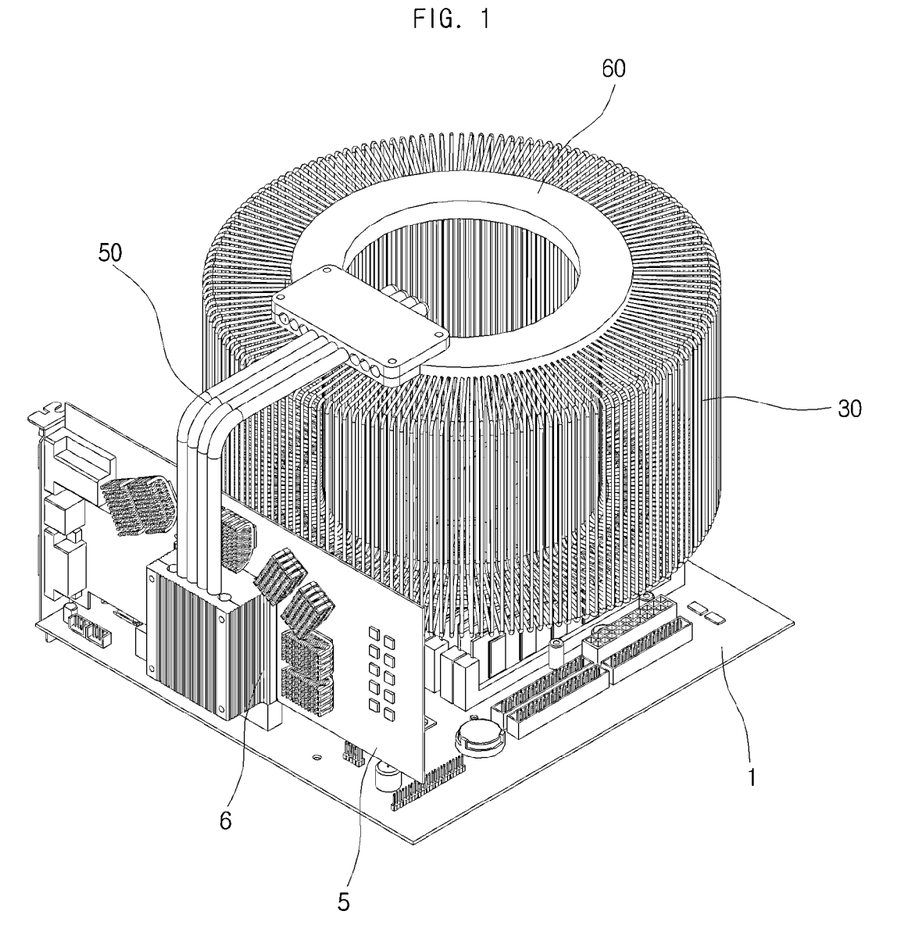
FIG. 1 and FIG. 2 show perspective views in which a heat-dissipating device for an electronic apparatus in accordance with an embodiment of the present invention is mounted.
Figure 2:
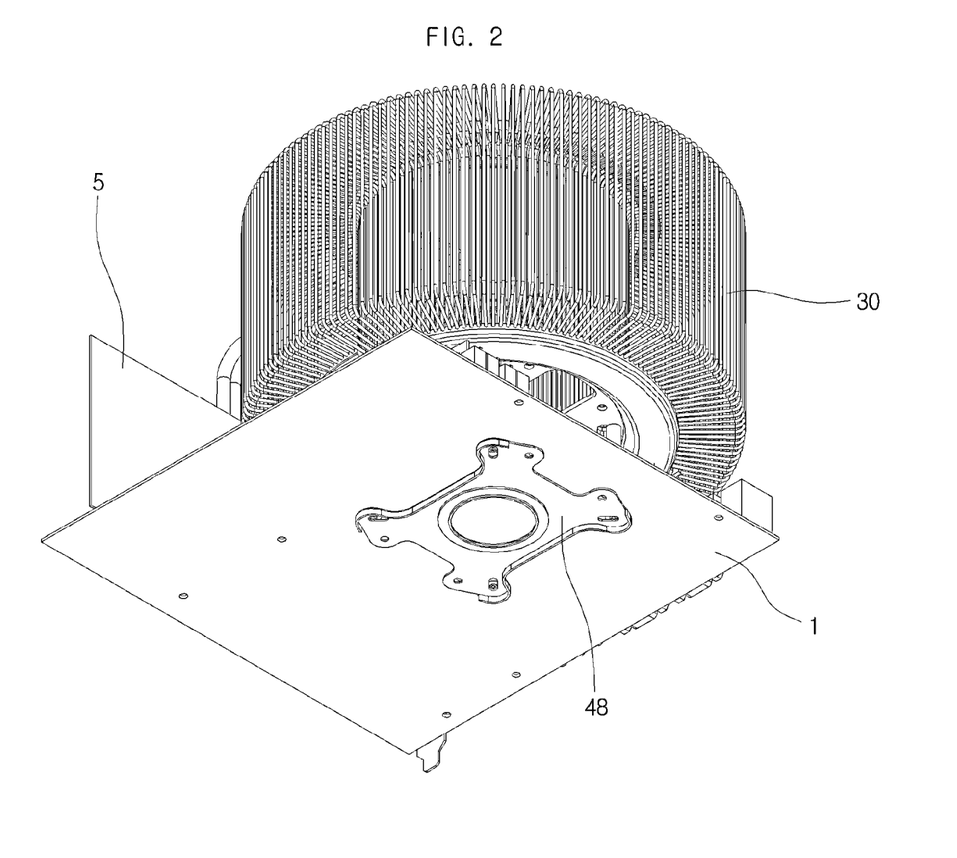
Figure 3:
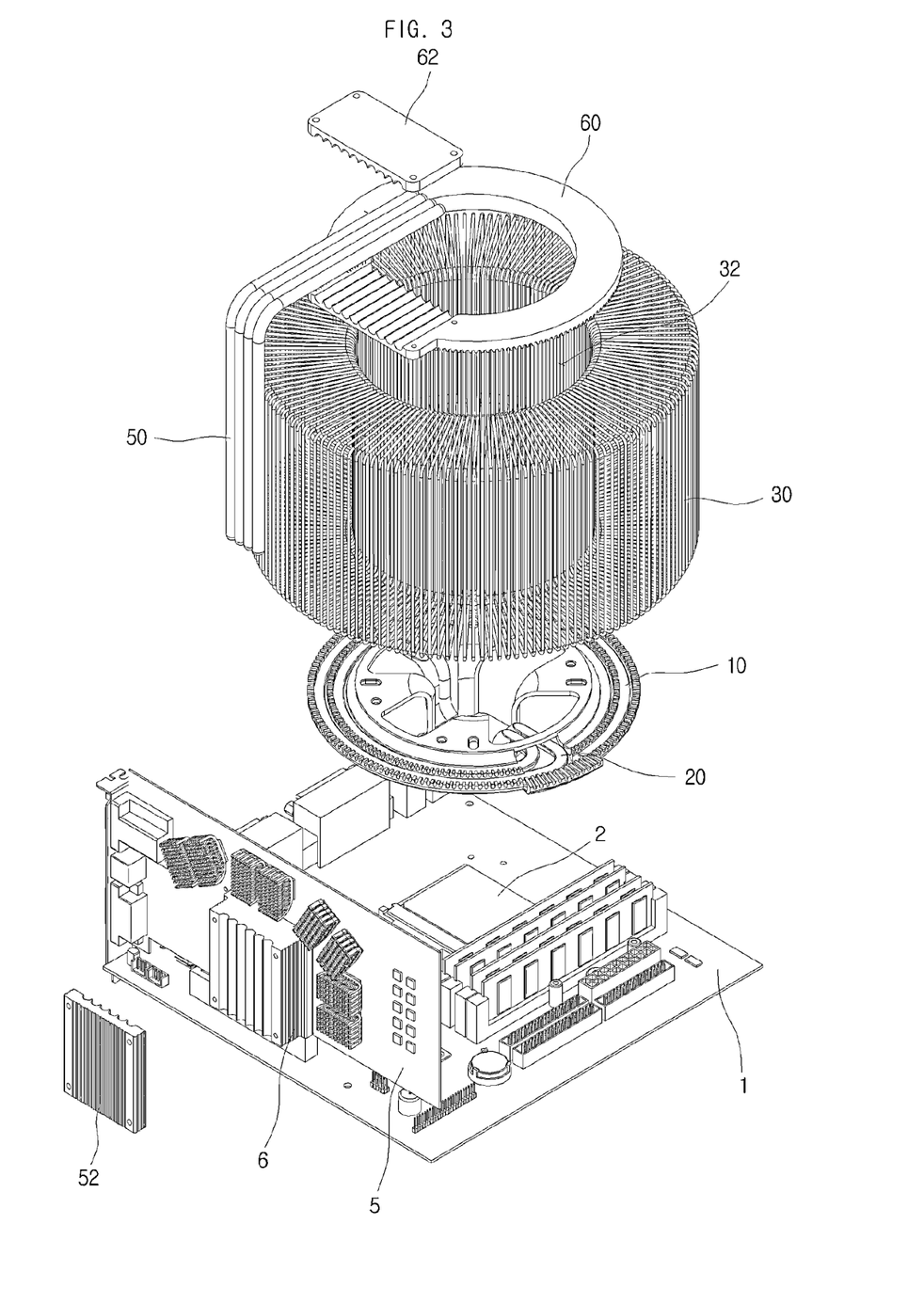
FIG. 3 is an exploded perspective view showing the heat-dissipating device for an electronic apparatus in accordance with an embodiment of the present invention.
Figure 4:
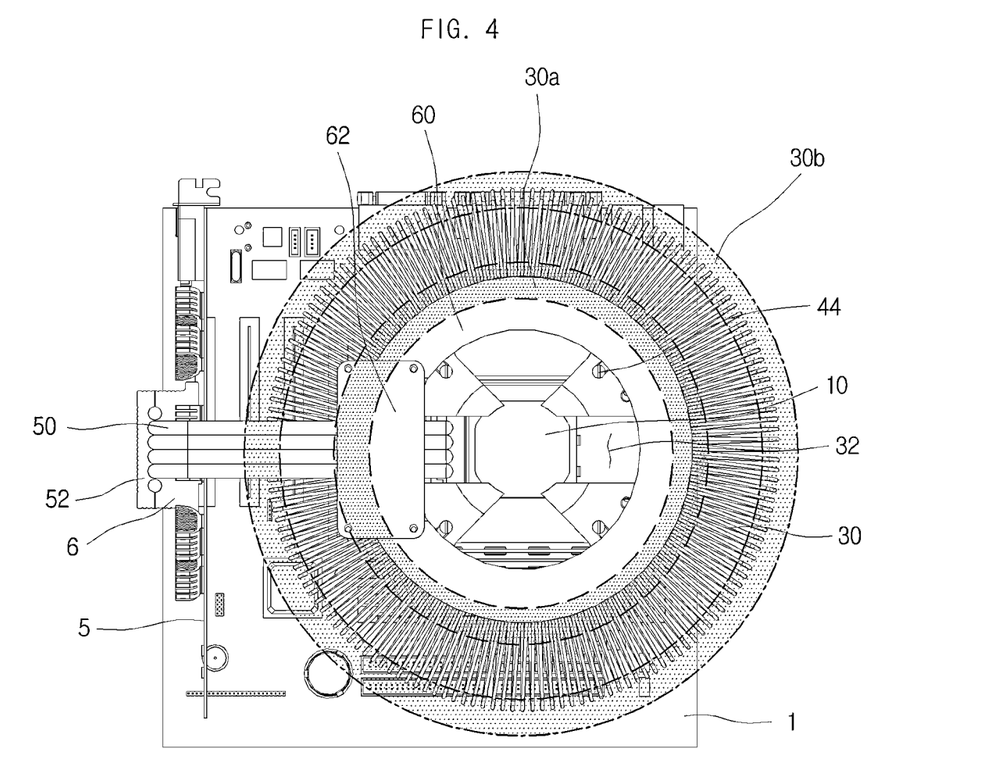
FIG. 4 shows a top view in which the heat-dissipating device for an electronic apparatus in accordance with an embodiment of the present invention is mounted.
Figure 5:
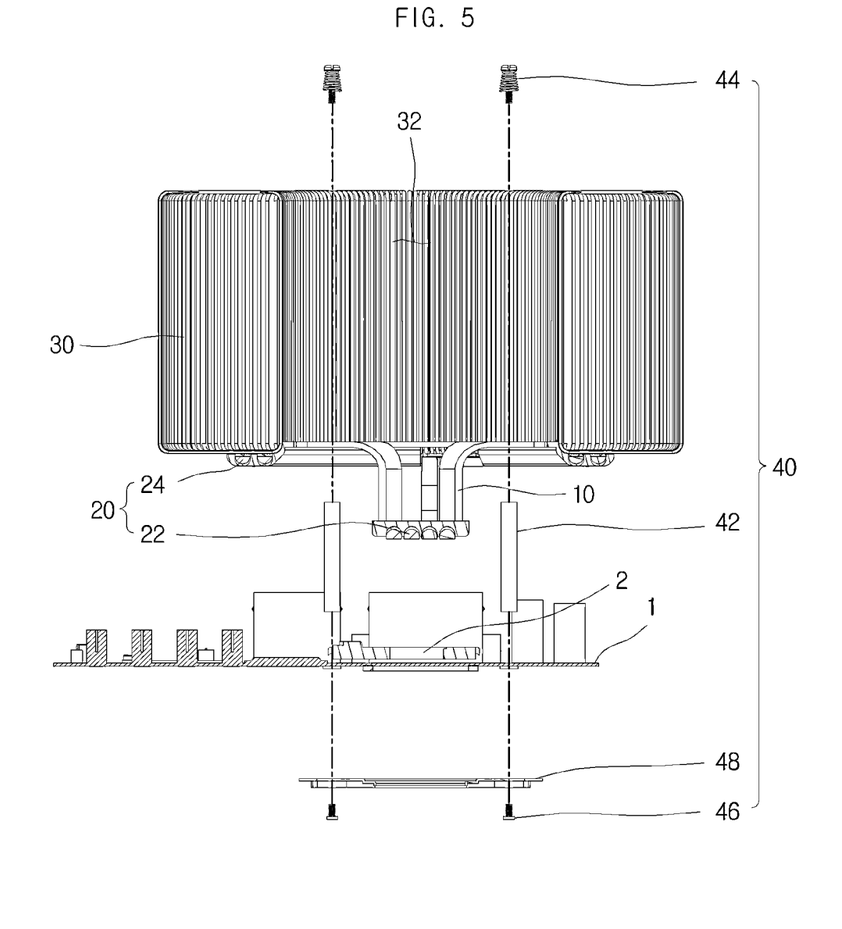
FIG. 5 illustrates how the heat-dissipating device for an electronic apparatus in accordance with an embodiment of the present invention is assembled.

FIG. 1 and FIG. 2 show perspective views in which a heat-dissipating device for an electronic apparatus in accordance with an embodiment of the present invention is mounted, and FIG. 3 is an exploded perspective view showing the heat-dissipating device for an electronic apparatus in accordance with an embodiment of the present invention. FIG. 4 shows a top view in which the heat-dissipating device for an electronic apparatus in accordance with an embodiment of the present invention is mounted, and FIG. 5 illustrates how the heat-dissipating device for an electronic apparatus in accordance with an embodiment of the present invention is assembled.

The heat-dissipating device for an electronic apparatus in accordance with an embodiment of the present invention includes a thermal base 10 and a heat-pipe loop 30. Here, as the heat-pipe loop 30 is radially disposed with its central area 32 hollowed out, the heat-dissipating device for an electronic apparatus of the present embodiment can allow the thermal base 10 to be readily assembled to a substrate 1 by a coupling member 40 through the hollowed-out central area 32.

The substrate 1 of the present embodiment is a main board, and a CPU mounted on the main board becomes a first electronic component 2 that dissipates heat.

The thermal base 10 is a part that absorbs the heat generated by the first electronic component 2 mounted on the substrate 1 and transfers the heat to the heat-pipe loop 30, and also supports the heat-pipe loop 30. For this, the thermal base 10 is mounted on the substrate 1 and is coupled with the first electronic component 2 in such a manner that enables heat-transfer therebetween.

Figure 6:
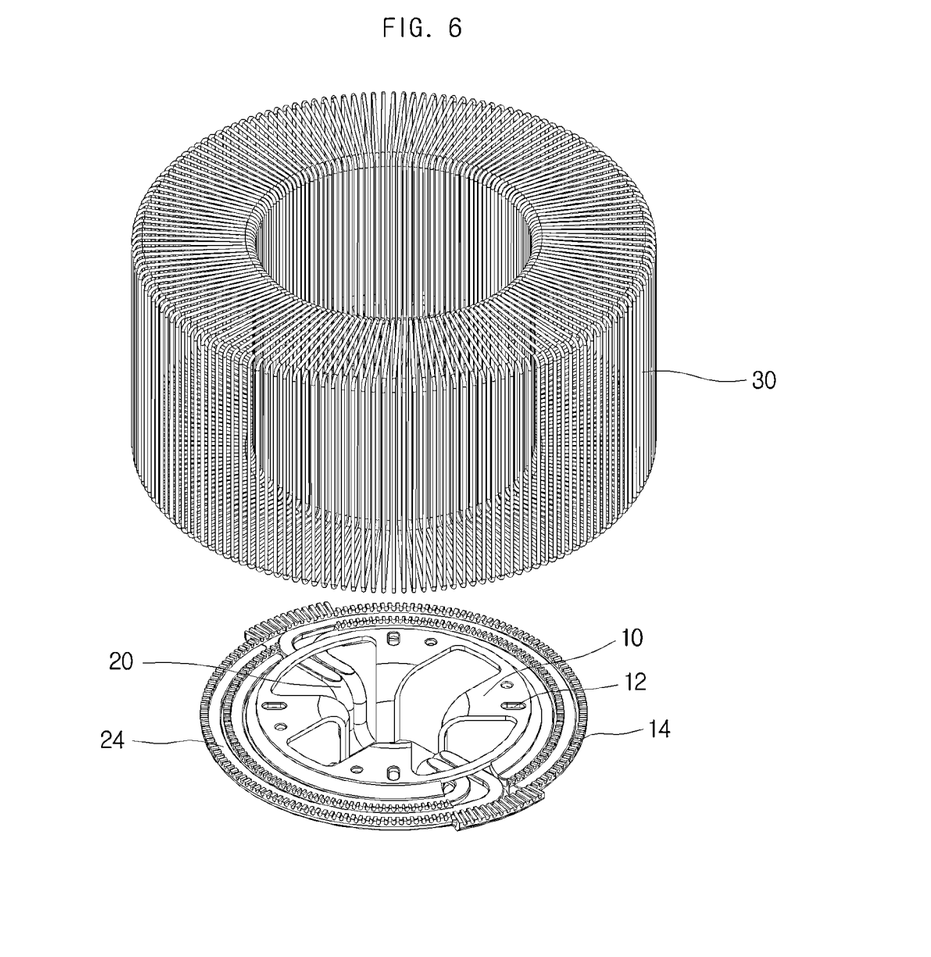
FIG. 6 and FIG. 7 illustrate how a thermal base and a heat-pipe loop are coupled in the heat-dissipating device for an electronic apparatus in accordance with an embodiment of the present invention.
Figure 7:
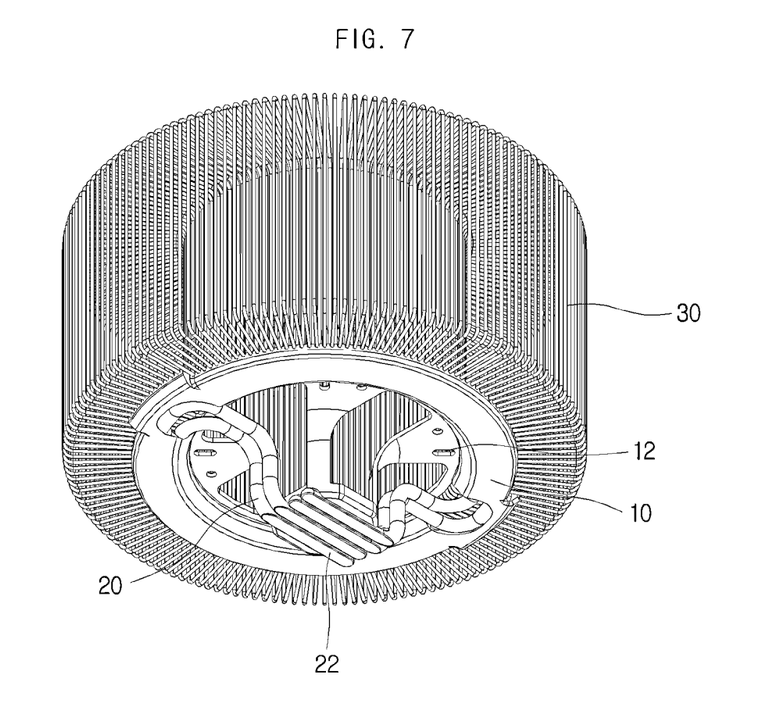

FIG. 6 and FIG. 7 illustrate how the thermal base and the heat-pipe loop are coupled in the heat-dissipating device for an electronic apparatus in accordance with an embodiment of the present invention.

As shown in FIGS. 5 to 7, one surface of the thermal base 10 of the present embodiment that faces the substrate 1 makes surface contact with the second electronic component 2, and the other surface that supports the heat-pipe loop 30 is coupled with the radially-disposed heat-pipe loop 30. Here, the thermal base 10 can be made of a metal, such as copper, aluminum and the like, which have high thermal conductivity.

Specifically, the one surface of the thermal base 10 can be formed in a shape corresponding to the shape of the first electronic component 2 and protruded toward the substrate 1 so as to be properly received by the first electronic component 2. Accordingly, the thermal base 10 can be readily coupled with the first electronic component 2 and can avoid interfering with other electronic components near the first electronic component 2. In addition, the other surface of the thermal base 10 can be formed in the shape of a disk with a central area caved in and can have a plurality of insertion grooves 14, into which a heat pipe is inserted, radially formed thereon, in such a way that the thermal base 10 can be coupled with the radially-disposed heat-pipe loop 30 having the hollowed-out central area 32.

Moreover, the thermal base 10 of the present embodiment can have a locking hole 12 formed therein so that a coupling screw of the coupling member 40 can be fastened.

Although it is presented in the present embodiment that the thermal base 10 absorbs the heat by being in direct contact with the first electronic component 2, the present invention is not restricted to what is described in the present embodiment, and it is possible that the heat generated by the first electronic component 2 is absorbed by the thermal base 10 via a heat-transfer member such as a wick-type heat pipe, which will be described later.

The coupling member 40 is a part that couples the thermal base 10 to the substrate 1. Particularly, the coupling member 40 of the present embodiment can be assembled through the hollow central area 32 of the radially-disposed heat-pipe loop 30.

As shown in FIGS. 4 and 5, the area where the coupling member 40 is assembled with the thermal base 10 is exposed to an outside through the hollow central area 32 of the heat-pipe loop 30. Accordingly, a pathway is secured to allow a tool or a user's hand to readily reach the assembly area during the assembly.

The coupling member 40 of the present embodiment can include a support bar 42, of which one end is coupled on the substrate and the other end is coupled to the thermal base 10, and coupling screws 44, 46, which couple the support bar 42 to the substrate 1 or the thermal base 10.

Specifically, as shown in FIG. 5, the one end of the support bar 42 can be supported to a heat-dissipating device mounting area, which is generally formed around the CPU in the main board. Then, the support bar 42 can be coupled to the substrate 1 through the coupling screw 46 that is coupled to a back surface of the main board. Here, a support bracket 48 can be additionally coupled to the back surface of the main board in order to securely couple the support bar 42 and reinforce the rigidity in the main board.

Moreover, the thermal base 10 can be securely received and supported by the other end of the support bar 42. Accordingly, the thermal base 10, which is relatively large compared to the heat-dissipating device mounting area formed in the main board, can be stably mounted, and thus the heat-dissipating device for a large electronic apparatus can be also mounted on the substrate 1. Particularly, as the coupling screw 44 that couples the thermal base 10 to the support bar 42 is assembled through the hollow central area of the radially-disposed heat-pipe loop 30, the heat-dissipating device for a large electronic apparatus that covers the main substrate 1 (see FIG. 1) can be also assembled to the substrate 1.

Although it is presented in the present embodiment that the coupling member is constituted with the support bar 42 and the coupling screws 44, 46, the present invention is not restricted to what is described in the present embodiment, and it is possible that the coupling member 40 is embodied in various known forms, such as a coupling pin or a long coupling screw that couples the thermal base 10 to the substrate 1 directly.

The heat-pipe loop 30 is a part that dissipates heat generated by the first electronic component 2 mounted on the substrate 1. For this, the heat-pipe loop 30 is coupled to the thermal base 10, which absorbs the heat generated by the first electronic component 2, in such a manner that enables heat-transfer therebetween. Specifically, the heat-pipe loop 30, in which a heat pipe is formed in the shape of a loop, includes a first heat-absorption portion, which is coupled with the thermal base 10 in such a manner that enables heat-transfer therebetween, and a heat-dissipating portion, which discharges heat absorbed by the first heat-absorption portion.

As shown in FIGS. 4 and 7, a lower portion of a portion 30a adjacent to the hollow central area of the heat-pipe loop 30 becomes the first heat-absorption portion, which is coupled to the thermal base 10 and is transferred with the heat. An outer portion 30b of the heat-pipe loop 30 that is separated from the thermal base 10 becomes the heat-dissipating portion.

Particularly, the heat-pipe loop 30 of the present embodiment is constituted with a vibrating capillary shape of heat pipe using hydrodynamics, making it possible to emanate a large amount of heat quickly. Moreover, since the capillary shape of heat pipe is light-weight, the heat-pipe loop 30 is structurally stable when supported by the thermal base 10. Accordingly, the heat-pipe loop 30 can be mounted stable on the substrate 1.

The vibrating capillary-shaped heat pipe has a structure in which working fluid and air bubbles are injected into the capillary in a predetermined ratio and then an inside of the capillary is sealed from an outside. Accordingly, the vibrating capillary-shaped heat pipe has a heat-transfer cycle in which the heat is mass transported in the form of latent heat by volume expansion and condensation of the air bubbles and working fluid.

In a heat-transfer mechanism, as nucleate boiling occurs in the heat-absorption portion by as much as the absorbed amount of heat, volume expansion occurs in the air bubbles located in the heat-absorption portion. Here, since the capillary maintains a fixed internal volume, the air bubbles located in the heat-dissipating portion condense by as much as the expanded volume of the air bubbles located in the heat-absorption portion. Accordingly, the state of pressure equilibrium in the capillary becomes broken, resulting in a flow accompanied with vibrations of the working fluid and the air bubbles within the capillary, and thus heat-dissipation is carried out as the latent heat is transported by the rise and fall of the temperature caused by the volume change of the air bubbles.

Here, the vibrating capillary-shaped heat pipe can include the capillary made of a metal, such as copper, aluminum and the like, which have high thermal conductivity.

As indicated in FIG. 6, the heat-pipe loop 30 of the present embodiment is constituted by having unit loops consecutively connected with one another and can be formed in a spiral structure. The spiral structure in which the capillary is wound in tight intervals can allow the long capillary disposed efficiently in a limited space.

In addition, the heat-pipe loop 30 of the present embodiment can be disposed in an annular shape in such a way that both ends of the spiral structure of heat-pipe loop 30 face each other. Accordingly, as the heat-pipe loop 30 is formed in a radial shape with the central area 32 hollowed out, an assembly area of the coupling member 40 is exposed through the hollow central area 32, as described above, making it possible for the coupling member 40 to be readily coupled with the thermal base 10. Moreover, since the radial structure with the hollow central area 32 has better aeration regardless of its installation direction, the heat-pipe loop 30 of the present embodiment can maintain a superb heat-dissipating performance regardless of its installation direction.

Here, both an open loop and a close loop are possible for a communication structure of the heat-pipe loop 30. Moreover, if the heat-pipe loop 30 is provided in plurality, all or some of the plurality of heat-pipe loops 30 can be communicated with neighboring heat-pipe loops 30. Accordingly, the plurality of heat-pipe loops 30 can have an entirely open or close loop shape according to design requirement.

Although it is presented in the present embodiment that the heat-pipe loop 30 has a spiral structure in which unit loops are consecutively connected, the present invention is not restricted to what is described in the present embodiment, and the shape of the heat-pipe loop 30 includes various loop shapes, for example, individually-formed unit loops disposed one by one.

The heat-dissipating device for an electronic apparatus in accordance with the present embodiment can also include a first heat-transfer pipe 20, which is coupled with the first electronic component 2 and the heat-pipe loop 30 in such a manner that enables heat-transfer therebetween. Specifically, one end part 22 of the first heat-transfer pipe 20 of the present embodiment can be coupled with the first electronic component 2 in such a manner that enables heat-transfer therebetween, and the other end part 24 can be disposed on the thermal base 10 so as to be coupled with the first heat-absorption portion of the heat-pipe loop 30 in such a manner that enables heat-transfer therebetween.

Particularly, the first heat-transfer pipe 20 of the present embodiment can be constituted in a wick type of heat pipe so as to quickly transfer a large amount of heat.

The wick type of heat pipe is constituted with a sealed pipe, into which the working fluid is injected, a wick, through which the working fluid moves, formed on an inner wall of the pipe, and a vapor moving space, in which vaporized working fluid moves within the pipe. In describing the functions specifically, the working fluid vaporized at which the heat is transferred moves through the vapor moving space to a heat-transfer portion, which transfers the heat to an outside. Then, the vaporized working fluid that has moved to the heat-transfer portion becomes condensed and transfers evaporation heat to the heat-transfer portion. The condensed working fluid flows back to an original position through the wick. Accordingly, a heat-transfer cycle of transferring the heat to the heat-transfer portion is completed.

The wick type of heat pipe having the above-described heat-transfer structure has a relatively larger diameter of tube than the capillary-shaped heat pipe and can have a large quantity of working fluid injected thereinto. Accordingly, the first heat-transfer pipe 20 can quickly transfer the heat from a heat source, such as the first electronic component 2, to the heat-pipe loop 30 so as not to have the heat from the heat source accumulated and can increase the heat-dissipating efficiency FIG. 8 illustrates how the thermal base and the first heat-transfer pipe are coupled in the heat-dissipating device for an electronic apparatus in accordance with an embodiment of the present invention.

Figure 8:
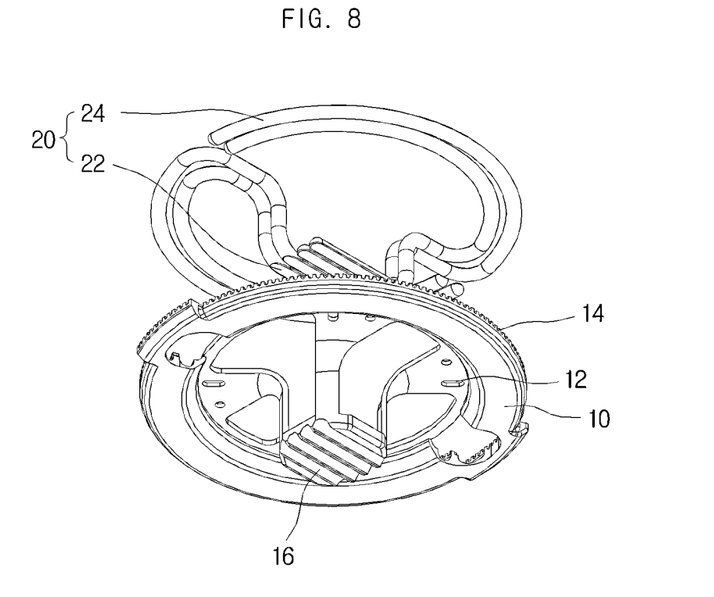
FIG. 8 illustrates how the thermal base and a first heat-transfer pipe are coupled in the heat-dissipating device for an electronic apparatus in accordance with an embodiment of the present invention.

As illustrated in FIGS. 6 to 8, the one end part 22 of the first heat-transfer pipe 20 is disposed in a mounting groove 16 on the one surface of the thermal base 10 facing the first electronic component 2, and thus the one end part 22 of the first heat-transfer pipe 20 can be in contact with the first electronic component 2 when the thermal base 10 makes contact and is coupled with the first electronic component 2.

Moreover, the other end part 24 of the first heat-transfer pipe 20 is disposed in an annular shape on the other surface of the thermal base 10 that supports the radially-disposed heat-pipe loop 30, and thus the other end part 24 of the first heat-transfer pipe 20 can face and make contact with the first heat-absorption portion that is formed in an annular shape on the radially-disposed heat-pipe loop 30.

Although it is described that the first heat-transfer pipe 20 of the present embodiment is in direct contact with the first electronic component 2 and the heat-pipe loop 30, the present invention is not restricted to the structure described herein, and it is also possible that the first heat-transfer pipe 20 is coupled with the first electronic component 2 and the heat-pipe loop 30 in such a manner that enables heat-transfer therebetween, instead of being directly coupled with the first electronic component 2 or the heat-pipe loop 30.

Meanwhile, the heat-dissipating device of the present embodiment can also include a second heat-transfer pipe 50, which is coupled with a second electronic component 6 and the heat-pipe loop 30 in such a manner that enables heat-transfer therebetween, so that heat generated by the second electronic component 6 can be dissipated at the same time. Here, the second heat-transfer pipe 50 can also use the wick-type heat pipe.

As illustrated in FIGS. 1 and 3, the electronic apparatus can include the second electronic component 6, which is mounted on the substrate 1 or a supplementary substrate 5 coupled to the substrate 1, in addition to the first electronic component 2, which is mounted on the substrate 1. Moreover, the second electronic component 6 can also generate a large amount of heat, like a chipset of a video card, requiring dissipation of heat. Here, the heat-dissipating device for an electronic apparatus in accordance with the present embodiment can dissipate the heat generated by the second electronic component 6 as well as the first electronic component 2, by additionally having the second heat-transfer pipe 50, which is coupled with the second electronic component 6 and the heat-pipe loop 30, in such a manner that enables heat-transfer therebetween.

For this, one end part of the second heat-transfer pipe 50 can be coupled with the second electronic component 6, which is mounted on the substrate 1 or the supplementary substrate 5 coupled to the substrate 1, in such a manner that enables heat-transfer therebetween, and the other end part of the second heat-transfer pipe 50 can be coupled with a second heat-absorption portion, which is formed on the heat-pipe loop 30, in such a manner that enables heat-transfer therebetween.

Specifically, in the present embodiment, the one end part of the second heat-transfer pipe 50 can be coupled to the chipset of the video card, which is coupled to the main board, through a first cover member 52. Then, the other end part of the second heat-transfer pipe 50 can be coupled to a thermal block 60, which is coupled to the second heat-absorption portion of the heat-pipe loop 30, through a second cover member 62. Here, the thermal block 60 can be formed in an annular shape and thus can be coupled with the second heat-absorption portion (an upper portion of a portion 30a adjacent to the central area 32; see FIG. 4), which is formed in an annular shape in the radially-disposed heat-pipe loop 30.

Hereinafter, a heat-dissipating device for an electronic apparatus in accordance with another embodiment of the present invention will be described.

The heat-dissipating device for an electronic apparatus in accordance with another embodiment of the present invention is different from the above-described embodiment in that a thermal base 10' has a heat-transfer structure of the above-described heat-transfer pipe. Hereinafter, description will be provided not for identical elements but for differences only.

Figure 9:
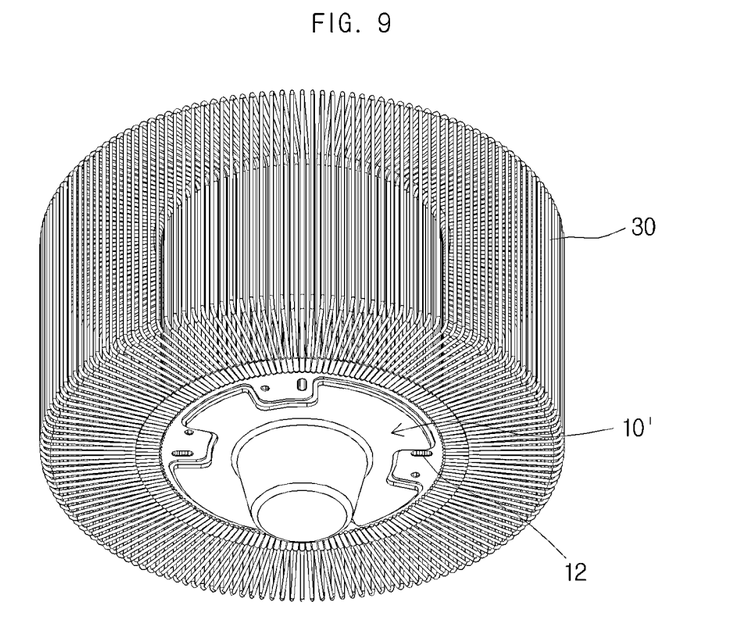
FIG. 9 is a perspective view showing a heat-dissipating device for an electronic apparatus in accordance with another embodiment of the present invention.
Figure 10:
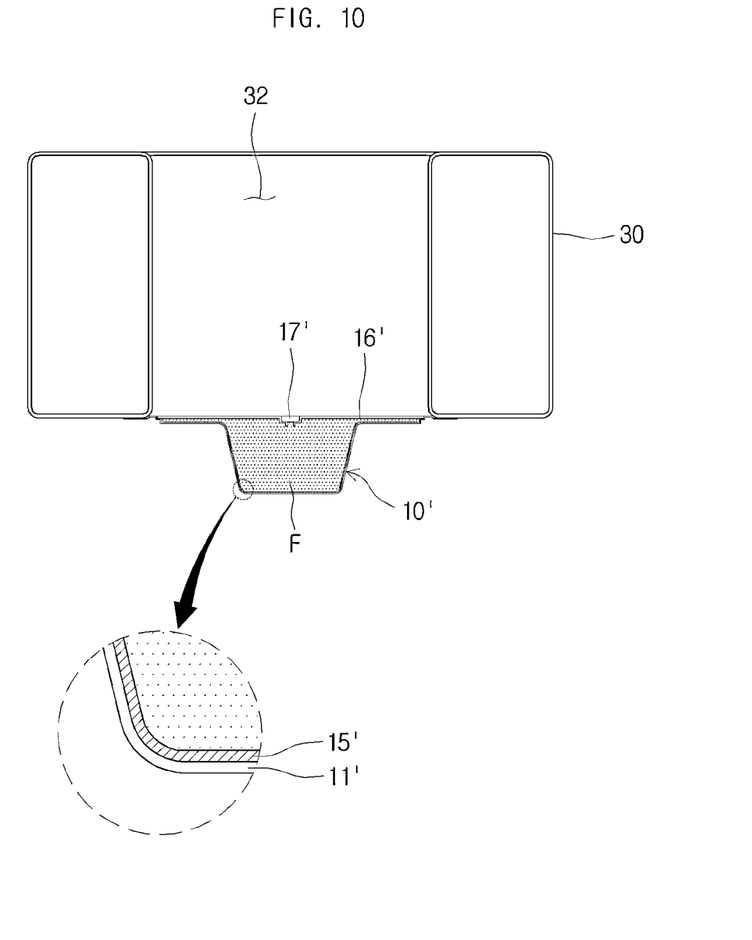
FIG. 10 is a cross-sectional view showing the electronic apparatus in accordance with another embodiment of the present invention.
Figure 11:
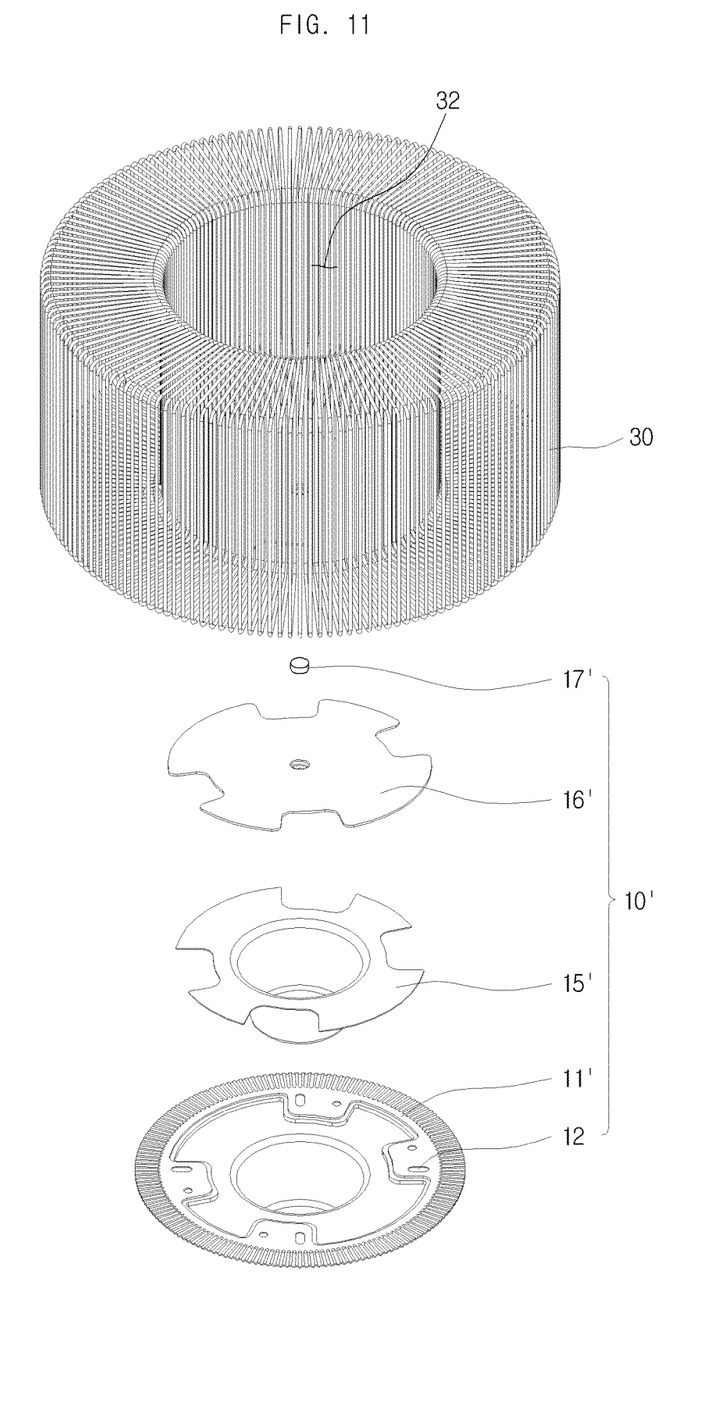
FIG. 11 is an exploded perspective view showing the electronic apparatus in accordance with another embodiment of the present invention.

FIG. 9 is a perspective view showing the heat-dissipating device for an electronic apparatus in accordance with another embodiment of the present invention, and FIG. 10 is a cross-sectional view showing the electronic apparatus in accordance with another embodiment of the present invention. FIG. 11 is an exploded perspective view showing the electronic apparatus in accordance with another embodiment of the present invention.

The heat-dissipating device for an electronic apparatus in accordance with the present embodiment features that a large amount of heat can be quickly transferred by the thermal base 10' itself. For this, the thermal base 10' of the present embodiment encompasses a heat-transfer structure of a wick-type heat pipe.

As illustrated in FIG. 10, the thermal base 10' of the present embodiment has a chamber, into which working fluid (F) is injected, formed therein, and a wick is formed on a wall of the chamber. Accordingly, like the heat-transfer procedures of the above-described wick-type heat pipe, absorbed heat can be quickly transferred to the heat-pipe loop 30 through the procedures of vaporizing and condensing the working fluid (F) within the wick.

Here, the thermal base 10' of the present embodiment can be constituted by assembling a base member 11', a wick member 15' and a cover member 16'. Accordingly, the thermal base 10' encompassing the heat-transfer structure of the wick-type heat pipe can be readily fabricated.

Specifically, as illustrated in FIGS. 9 and 11, one surface of the base member 11' in the shape of a disk is protruded toward a first electronic component in such a manner that enables heat-transfer therebetween. Moreover, the other surface of the base member 11' is caved in such that the chamber, into which the working fluid (F) is injected, is formed. In other words, the base member 11' has a protruded portion, an inside of which is hollowed out in the shape of a cup, formed therein.

The wick member 15' is a portion containing the wick and is coupled to an inside wall of the caved-in base member 11'. Accordingly, the wick is formed on an inner wall of the chamber that is formed in the caved-in portion of the base member 11'.

Here, the wick member 15 of the present embodiment can include a porous structure of sintered wick. The sintered wick can be formed by heating or pressurizing metal powder or by heating and pressurizing the metal powder at the same time.

Particularly, the sintered wick of the present embodiment is characterized by being fabricated before being coupled to the base member 11'. Generally, when a sintered wick is fabricated, the wick is heated, or heat is generated. Accordingly, if the sintered wick is formed directly on the base member 11', the base member' is annealed by the heat, thereby possibly lowering the hardness of the base member 11'. Therefore, in the present embodiment, the sintered wick is separately formed first before coupling the sintered wick to the base member 11', in order to prevent the hardness of the base member 11' from being lowered.

Although the sintered wick is presented for the wick member 15' in the present embodiment, the wick member 15' is not restricted to the sintered wick, and the wick member 15' can include a mesh-type structure of wick, such as a net made of metallic material or fabric material. Moreover, in addition to the sintered wick and the mesh-type wick, the wick member 15' can include a variety of members having a porous structure therein so that vaporization and condensation of the working fluid (F) can be carried out.

The cover member 16' forms the chamber inside the thermal base 10' by covering the wick member 15' and the caved-in portion on the other surface of the base member 11'.

In the present embodiment, an injection port is formed in the cover member 16' in order to facilitate injection of the working fluid (F). Then, the injection port is sealed with a sealing member 17' once the working fluid (F) is injected.

While the present invention has been described with reference to certain embodiments, the embodiments are for illustrative purposes only and shall not limit the invention. It is to be appreciated that those skilled in the art can change or modify the embodiments without departing from the scope and spirit of the invention.

It shall be also appreciated that a very large number of embodiments other than those described herein are possible within the scope of the present invention, which shall be defined by the claims appended below.

INDUSTRIAL APPLICABILITY

The heat-dissipating device for an electronic apparatus in accordance with the present invention can be stably mounted on the substrate as a result of better structural stability and lighter weight due to a light-weight capillary-shaped heat pipe.

Moreover, Assembly performance can be enhanced by securing a pathway in the heat-dissipating device for an electronic apparatus and the assembly area of the substrate, which enables a tool or a user's hand to reach therewithin.

Furthermore, the heat-dissipating device for an electronic apparatus in accordance with the present invention either does not use a heat-dissipating fan or uses a low-speed heat-dissipating fan, and thus heat can be dissipated with little or no noise.

The invention claimed is:

1. A heat-dissipating device for an electronic apparatus, comprising:
    a thermal base coupled to a first electronic component in such a manner that enables heat-transfer therebetween so that heat generated by the first electronic component mounted on a substrate is absorbed thereby; and
    a vibrating capillary-shaped heat-pipe loop comprising a first heat-absorption portion coupled with the thermal base in such a manner that enables heat-transfer therebetween and a heat-dissipating portion configured to dissipate heat absorbed by the first heat-absorption portion, the heat-pipe loop having working fluid injected thereinto,
    wherein the heat-pipe loop is radially disposed with a central area thereof hollowed out, and
    wherein an assembly area of a coupling member is exposed in the central area so that the coupling member for coupling the thermal base to the substrate is coupled through the central area.

2. The heat-dissipating device for an electronic apparatus of claim 1, wherein the heat-pipe loop is formed in a spiral structure and disposed in an annular shape so that the heat-dissipating portion is radially formed.

3. The heat-dissipating device for an electronic apparatus of claim 1, wherein the coupling member comprises:
    a support bar of which one end is coupled on the substrate and the other end is coupled to the thermal base; and
    a coupling screw configured to couple the support bar to the substrate or the thermal base.

4. The heat-dissipating device for an electronic apparatus of claim 1, further comprising a first heat-transfer pipe having working fluid injected thereinto and having a wick formed on an inner wall thereof and coupled with the first electronic component and the heat-pipe loop in such a manner that enables heat-transfer therebetween.

5. The heat-dissipating device for an electronic apparatus of claim 4, wherein one end part of the first heat-transfer pipe is coupled with the first electronic component in such a manner that enables heat-transfer therebetween, and
    wherein the other end part of the first heat-transfer pipe is disposed on the thermal base so as to be coupled with the first heat-absorption portion of the heat-pipe loop in such a manner that enables heat-transfer therebetween.

6. The heat-dissipating device for an electronic apparatus of claim 5, wherein the one end part of the first heat-transfer pipe is disposed on one surface of the thermal base facing toward the first electronic component, and
    wherein the other end part of the first heat-transfer pipe is disposed in an annular shape on the other surface of the thermal base supporting the radially-disposed heat-pipe loop.

7. The heat-dissipating device for an electronic apparatus of claim 1, wherein the thermal base has a chamber formed therein, the chamber having working fluid injected thereinto, and wherein the chamber has a wick formed on a wall thereof.

8. The heat-dissipating device for an electronic apparatus of claim 7, wherein the thermal base comprises:

- a base member having one side thereof protruded so as to be coupled with the first electronic component in such a manner that enables heat-transfer therebetween and having the other side thereof caved in so that the chamber is formed therein;
- a wick member coupled to an inside wall of the caved-in base member; and
- a cover member covering the wick member and the other side of the base member.

9. The heat-dissipating device for an electronic apparatus of claim 8, wherein the wick member comprises a sintered wick.

10. The heat-dissipating device for an electronic apparatus of claim 9, wherein the sintered wick is fabricated first before being coupled to the base member.

11. The heat-dissipating device for an electronic apparatus of claim 8, wherein the wick member comprises a mesh-type wick.

12. The heat-dissipating device for an electronic apparatus of claim 1, further comprising a second heat-transfer pipe having a wick formed on an inner wall thereof and having working fluid injected thereinto, wherein one end part of the second heat-transfer pipe is coupled with a second electronic component, which is mounted on the substrate or a supplementary substrate coupled to the substrate, in such a manner that enables heat-transfer therebetween, and wherein the other end part of the second heat-transfer pipe is coupled with a second heat-absorption portion, which is formed on the heat-pipe loop, in such a manner that enables heat-transfer therebetween.

13. The heat-dissipating device for an electronic apparatus of claim 12, further comprising a thermal block formed in an annular shape and coupled with the radially-disposed heat-pipe loop and the other end part of the second heat-transfer pipe.

\* \* \* \* \*